United States Patent [19]

Kobayashi et al.

[11] Patent Number: 5,477,407
[45] Date of Patent: Dec. 19, 1995

[54] PROTECTION CIRCUIT FOR PROTECTING A SEMICONDUCTOR DEVICE FROM A VOLTAGE SURGE

[75] Inventors: Isamu Kobayashi; Yasunori Murase, both of Kasugai, Japan

[73] Assignees: Fujitsu Limited, Kawasaki; Fujitsu VLSI Limited, Kasugai, both of Japan

[21] Appl. No.: 297,761

[22] Filed: Aug. 30, 1994

[30] Foreign Application Priority Data

Dec. 17, 1993 [JP] Japan ..................... 5-318706

[51] Int. Cl.[6] ................ H02H 9/04; H01L 27/02
[52] U.S. Cl. ................ 361/56; 361/58; 361/91; 361/111; 361/118; 257/355; 257/532
[58] Field of Search ................ 361/56, 58, 91, 361/111, 118, 127; 257/532, 534, 535, 297, 355

[56] References Cited

U.S. PATENT DOCUMENTS

| | | | |
|---|---|---|---|
| 4,807,080 | 2/1989 | Clark | 361/56 |
| 4,821,089 | 4/1989 | Strauss | 357/68 |
| 4,825,280 | 4/1989 | Chen | 357/71 |
| 5,087,955 | 2/1992 | Futami | 357/41 |
| 5,264,723 | 11/1993 | Strauss | 257/532 |
| 5,345,356 | 9/1994 | Pianka | 361/56 |

FOREIGN PATENT DOCUMENTS

| | | | |
|---|---|---|---|
| 3-209759 | 9/1991 | Japan | H01L 27/04 |
| 3-248567 | 11/1991 | Japan | H01L 29/40 |

*Primary Examiner*—Todd Deboer
*Assistant Examiner*—S. Jackson
*Attorney, Agent, or Firm*—Armstrong, Westerman, Hattori, McLeland & Naughton

[57] ABSTRACT

An input protection circuit includes a conductor pattern extending from a first end connected to an input pad to a second end connected to an integrated circuit, first and second, mutually separated ground patterns disposed at both sides of the conductor pattern with a separation therefrom, a first gate pattern provided on a gap between the conductor pattern and the first ground pattern, and a second gate pattern provided on a gap between the conductor pattern and the second ground pattern, wherein the conductor pattern, the first ground pattern and the first gate pattern form a first transistor extending continuously from the first end to the second end of the conductor pattern at a first side of the conductor pattern, and wherein the conductor pattern, the second ground pattern and the second gate pattern form a second transistor extending continuously from the first end to the second end of the conductor pattern at a second side of the conductor pattern.

8 Claims, 7 Drawing Sheets

PROTECTION CIRCUIT FOR PROTECTING A SEMICONDUCTOR DEVICE FROM A VOLTAGE SURGE

BACKGROUND OF THE INVENTION

The present invention generally relates to semiconductor devices and more particularly to a protection circuit for use in semiconductor integrated circuits for protecting the same from voltage surge of input signals.

Recent semiconductor integrated circuits, particularly semiconductor memory devices such as SRAMs (static random access memory) or DRAMs (dynamic random access memory), have extremely fine patterned structures for increased integration density. Thus, such semiconductor integrated circuits are generally vulnerable to surge of electric input signals caused as a result of electrostatic discharge, and the like. When such a surge is applied, minute p-n junctions or capacitors in the integrated circuit easily cause breakdown.

In order to avoid such a breakdown of the essential part of the integrated circuit, currently used integrated circuits generally use a protection circuit between a bonding pad provided on the surface of a semiconductor chip, in which the integrated circuit is formed, and the input/output circuit of the integrated circuit, such that the voltage surge caused in the electric signals as a result of electrostatic discharge and the like, is dissipated immediately to the semiconductor substrate.

FIG. 1 shows an example of a conventionally used input protection circuit provided to an input stage of an integrated circuit.

Referring to FIG. 1, there is formed an input pad 1 on the surface of a semiconductor chip that constitutes a part of the integrated circuit, for achieving a connection to external circuits. Further, a conductor pattern 3, typically formed of aluminum or aluminum alloy, extends from the input pad 1 to a first stage circuit 2 of the integrated circuit designated as IC.

In the construction of FIG. 1, it will be noted that the conductor pattern 3 is connected to an N-channel MOS transistor $T_1$ that has a gate connected to the ground. Thus, the transistor $T_1$ is normally turned off. Only when a voltage surge is applied, the transistor $T_1$ turns on and the electric charges on the conductor pattern 3 are dissipated to the ground. In the normal operational state where no voltage surge is applied, it should be noted that the electric signal supplied to the input pad 1 is further supplied to a diffusion region forming the source of the transistor $T_1$ via the conductor pattern 3 and is supplied further to the first stage circuit 2 of the integrated circuit via a different conductor pattern of polysilicon. In FIG. 1, it should be noted that the resistance of the diffusion region is designated as $R_1$ and the resistance of the polysilicon pattern is designated as $R_2$.

When a large positive voltage is applied to the input pad 1 as a result of the voltage surge, on the other hand, the transistor $T_1$ causes a breakdown between the source and drain thereof, and the electric charges on the conductor pattern 3 are dissipated to the ground. Further, when a large negative voltage exceeding the threshold voltage of the transistor $T_1$ is applied to the input pad 1, the transistor $T_1$ also causes a conduction and the electric charges on the conductor pattern 3 are dissipated to the ground. Thus, the transistor $T_1$ and the resistances $R_1$ and $R_2$ form an input protection circuit 4 that clamps the voltage supplied to the circuit 2.

FIG. 2 shows the layout of the input protection circuit 4 of FIG. 1 provided on a semiconductor chip in a plan view. It should be noted that the illustrated example corresponds to the one disclosed in the Japanese Laid-open Patent Publication 3-209759, and is formed on a silicon substrate covered by an insulation film such as silicon oxide.

Referring to FIG. 2, the input protection circuit 4 includes an aluminum pattern 11 formed on a silicon oxide film provided on a silicon substrate. The aluminum pattern 11 corresponds to the conductor pattern 3 of FIG. 1 and is connected to an input pad (not shown) on the substrate. As will be understood from the plan view of FIG. 2, the aluminum pattern 11 has a comb-shaped form and includes fingers 11a–11c, wherein the fingers 11a–11c are connected electrically to an n-type diffusion region 13 formed in the silicon substrate by way of a plurality of contact holes 12 in the silicon oxide film. It should be noted that the diffusion region 13 forms the foregoing resistance $R_1$ of FIG. 1. Further, another aluminum conductor pattern 14 extends from the other end of the diffusion region 13 to the first stage input circuit 2 of the integrated circuit IC. Thereby, a polysilicon pattern (not illustrated) may be interposed between the aluminum conductor pattern 14 and the integrated circuit as the foregoing resistance $R_2$.

Further, there is provided another aluminum pattern 16 on the silicon oxide film on the silicon substrate such that the aluminum pattern has a comb-shaped form corresponding to the comb-shaped form of the aluminum pattern 11, wherein the aluminum pattern 16 is connected to the foregoing diffusion region 13 in the silicon substrate at contact holes 17 formed in the foregoing silicon oxide film on the semiconductor substrate. It should be noted that the aluminum pattern 16 is grounded and includes fingers 16a and 16b, such that the finger 16a extends between the fingers 11a and 11b of the pattern 11 with a generally uniform separation therefrom. Similarly, the finger 16b extends between the fingers 11b and 11c of the pattern 11, with a generally uniform separation. As a result, gaps $g_1$–$g_5$ are formed between the pattern 11 and the pattern 16 as indicated in FIG. 2, with a generally uniform width for each of the gaps $g_1$–$g_5$.

Further, a polysilicon pattern 18 including elongate fingers 18a–18e is provided underneath the silicon oxide film and hence below the level of the patterns 11 and 16 in electrical connection to the pattern 16 via contact holes 19 provided on the silicon oxide film, wherein the polysilicon pattern is disposed such that the fingers 18a–18e extend over the gaps $g_1$–$g_5$ respectively. The polysilicon pattern 18 is isolated from the underlying silicon substrate by means of another thin silicon oxide film, and there are formed a plurality of transistors $T_1$ having respective gates corresponding to the fingers 18a–18e of the polysilicon pattern 18, such that each of the transistors has a source corresponding to a part of the diffusion region 13 immediately below the contact hole 12 and a drain corresponding to a part of the diffusion region 13 immediately below the contact hole 17. It should be noted that the transistors $T_1$ thus formed include respective gates connected to corresponding drains by way of the contact holes 19, while the respective drains are connected to the ground via the contact holes 17 and the patterns 16.

FIG. 3 shows the operation of the input protection circuit having the layout of FIG. 2.

Referring to FIG. 3, electrons (or holes) corresponding to the input signal applied to the input pad 1 are caused to flow to the input stage circuit 2 of the integrated circuit IC via the conductor pattern 11, the diffusion region 13, and the conductor pattern 14. Thereby, the electrons are dissipated to the ground when the transistors $T_1$ formed in corresponding to the foregoing gaps $g_1$–$g_5$ cause a conduction as a result of voltage surge applied to the input pad 11.

In the illustrated layout of FIG. 2, however, there arises a problem in that majority of the electrons supplied from the input pad 1 flow to the conductor pattern 14 via the branch 11a, while little electrons flow to other branches 11b and 11c. Thus, when the transistors $T_1$ cause a conduction as a result of voltage surge, the electrons are dissipated to the ground preferentially through only one of the transistors $T_1$ that corresponds to the foregoing gap $g_1$, even though the transistors $T_1$ are formed in correspondence to all of the gaps $g_1$–$g_5$ and hence have a large current-carrying capacity. Thus, the conventional integrated circuit that uses the input protection circuit 4 of FIG. 2 has suffered from unsatisfactory surge suppression and risk of the integrated being damaged as a result of the voltage surge.

SUMMARY OF THE INVENTION

Accordingly, it is a general object of the present invention to provide a novel and useful input protection circuit for use in integrated circuits and an integrated circuit that uses such an input protection circuit wherein the foregoing problems are eliminated.

Another and more specific object of the present invention is to provide an input protection circuit of an integrated circuit as well as an integrated circuit that uses such an input protection circuit, wherein the current-carrying capacity of a transistor that forms the essential part of the input protection circuit is maximized.

Another object of the present invention is to provide an input protection circuit, comprising:

a conductor pattern provided on a semiconductor substrate formed with an integrated circuit, said conductor pattern having a first end connected to an input pad provided on said semiconductor substrate and a second, opposite end and defined by first and second edges both extending between said first and second ends;

a first ground pattern on said semiconductor substrate, said first ground pattern being defined by a third edge having a shape corresponding to said first edge, said first ground pattern being provided on said semiconductor substrate so as to form a first gap having generally a uniform width between said first and third edges;

a second ground pattern on said semiconductor substrate, said second ground pattern being defined by a fourth edge having a shape corresponding to said second edge, said second ground pattern being provided on said semiconductor substrate so as to form a second gap having generally a uniform width between said second and fourth edges;

a first gate pattern provided on said semiconductor substrate in correspondence to said first gap such that said first gate pattern extends with a separation from any of said first and third edges;

a second gate pattern provided on said semiconductor substrate in correspondence to said second gap such that said second gate pattern extends with a separation from any of said second and fourth edges;

a first channel region formed on said semiconductor substrate in correspondence to said first gate pattern;

a second channel region formed on said semiconductor substrate in correspondence to said second gate pattern;

a source region formed on said semiconductor substrate in correspondence to said conductor pattern;

a first drain region formed on said semiconductor substrate in correspondence to said first ground pattern;

a second drain region formed on said semiconductor substrate in correspondence to said second ground pattern;

a first contact structure provided on said conductor pattern for connecting said conductor pattern to said source region electrically;

a second contact structure provided on said first ground pattern for connecting said first ground pattern to said first drain region electrically;

a third contact structure provided on said second ground pattern for connecting said second ground pattern to said second drain region electrically;

a first ground structure for grounding said first gate pattern;

a second ground structure for grounding said second gate pattern;

a diffusion region formed on said semiconductor substrate so as to extend from said second end of said conductor pattern toward said integrated circuit, said diffusion region having a resistance; and a lead pattern extending from said diffusion region toward said integrated circuit for carrying electric signals supplied to said input pad to said integrated circuit;

said conductor pattern, said first ground pattern, said first gate pattern, said first channel region, said source region and said first drain region forming a first transistor;

said conductor pattern, said second ground pattern, said second gate pattern, said second channel region, said source region and said second drain region forming a second transistor;

said first and second ground patterns forming two spatially separated conducting members on said semiconductor substrate;

said first and second gate patterns forming two spatially separated conducting members on said semiconductor substrate;

said first and second drain regions being formed on said semiconductor substrate with a spatial separation from each other.

According to the present invention, the voltage surge applied to the input pad always flows through the conductor pattern from the first end to the second end. Thus, the voltage surge is effectively dissipated to the ground via the first and second transistors formed continuously from the first end to the second end of the conductor pattern respectively along the first and second edges. As the conductor pattern does not include any branches that do not contribute to the current path extending from the input pad to the integrated circuit, the input protection circuit of the present invention is inherently free from the problem of the electric current concentrating to a particular part of the conductor pattern when a surge is applied. Thereby, the problem of the conventional input protection circuit in that only a portion of the protection circuit contributes to the dissipation of the voltage surge is effectively eliminated. As the conductor pattern forms a substantially single current path extending continuously from the foregoing first end to the second end, the first and second ground patterns disposed at both sides of the conductor pattern in correspondence to the first and second edges inevitably form two spatially separated conducting members that are disposed across the conductor pattern. Associated therewith, the first and second gate patterns are formed of two conductive members spatially separated from each other across the conductor pattern.

In a preferred embodiment, it is possible to increase the area of the first and second transistors formed respectively between the first and third edges and between the second and forth edges, by forming the first and second edges of the conductor pattern to project laterally. Thereby, the efficiency of the protective circuit is increased further.

Further, by forming an additional diffusion region in the substrate such that the additional diffusion region extends further from the second end of the conductor pattern toward the integrated circuit, and by providing another conductor pattern connected to the integrated circuit such that the foregoing another conductor pattern is connected to the additional diffusion at a location offset from the foregoing second end, it is possible to insert a resistance to the signal path extending from the input pad to the integrated circuit in the form of diffusion resistance of the additional diffusion region.

Further, by forming the foregoing first and second gate patterns on the substrate in correspondence to the additional diffusion region such that the first and second gate patterns extend generally parallel with each other along the additional diffusion region with a mutual separation, it is possible to form additional transistors in the foregoing additional diffusion region in correspondence to the first and second gate patterns extending over such an additional diffusion region. Thereby, any voltage surge remaining after the processing by the input protection circuit as set forth before, is successfully absorbed by the additional transistors.

Other objects and further features of the present invention will become apparent from the following detailed description when read in conjunction with the attached drawings.

DETAILED DESCRIPTION OF PREFERRED EMBODIMENTS

Figure 4:
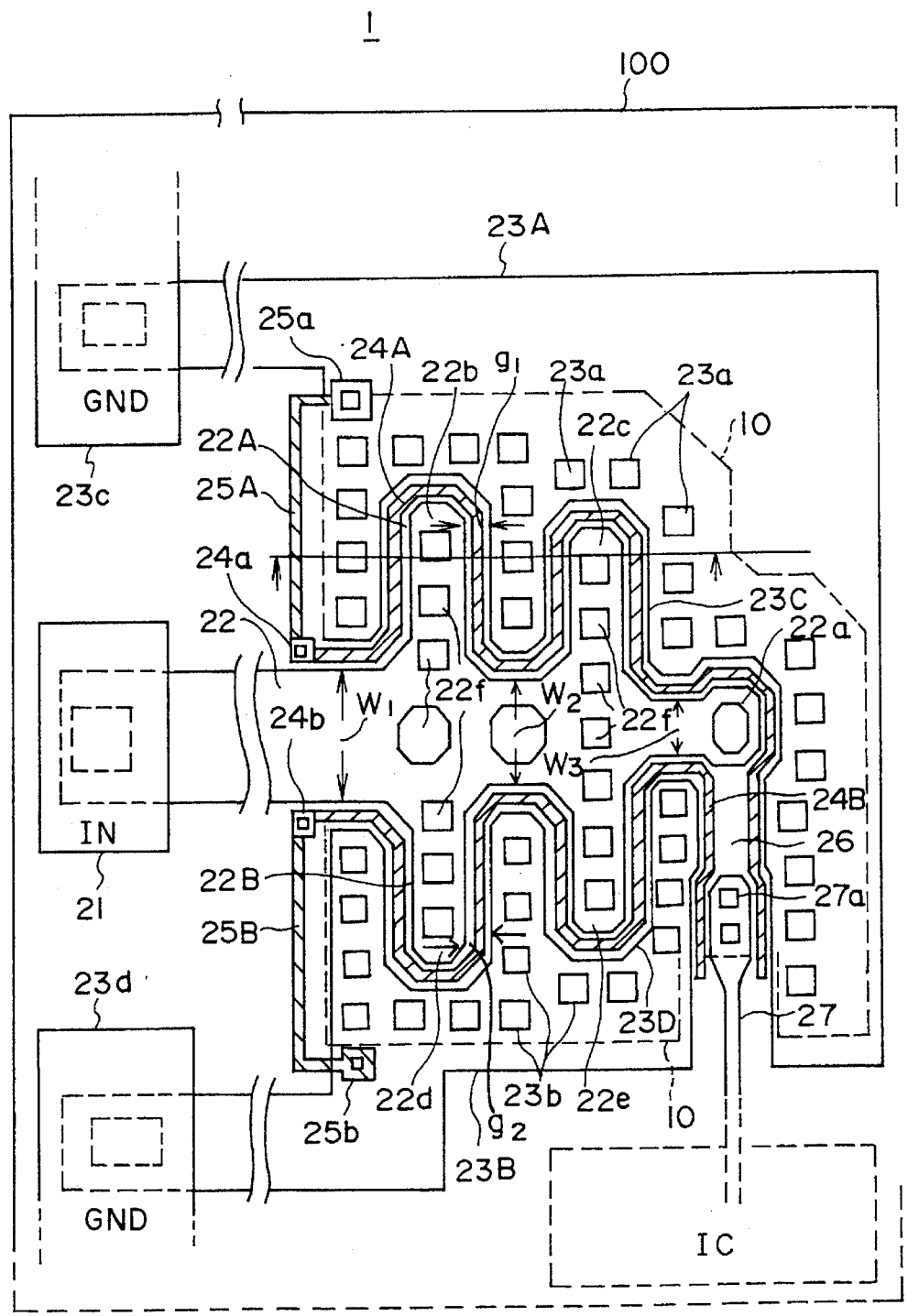
FIG. 4 is a diagram showing the layout of an input protection circuit according to a first embodiment of the present invention.

FIG. 4 shows the layout of an input protection circuit 1 according to a first embodiment of the present invention.

Referring to FIG. 4, the input protection circuit 1 is formed on a region 10 of a semiconductor substrate 100 of p-type silicon covered by a thin insulator layer (not shown in FIG. 4), wherein it should be noted that the semiconductor substrate 100 includes an integrated circuit IC therein. The insulator layer has a reduced thickness in correspondence to the foregoing region 10 and carries thereon an input pad 21 for connection to external circuits.

Further, there is provided a conductor pattern 22 of aluminum or aluminum alloy on the insulator layer such that the conductor pattern 22 extends from a first end corresponding to the input pad 21 to a second, opposite end 22a. The conductor pattern 22 is defined by first and second edges 22A and 22B, wherein the first edge 22A is formed of projections 22b and 22c projecting in a first lateral direction, while the second edge 22B is formed of projections 22d and 22e projecting in a second, opposite lateral direction. In the illustrated example, the projections 22b and 22c and the projections 22d and 22e are formed generally symmetrically with each other. It should be noted that the conductor pattern 22 is connected to the substrate 100 in correspondence to the foregoing region 10 by a plurality of contact holes 22f formed in the insulator layer on the substrate 100 not illustrated in FIG. 4.

Further, the insulator layer on the substrate 100 carries thereon a first ground pattern 23A having an edge 23C corresponding in shape to the foregoing edge 22A of the conductor pattern 22, such that there is formed a first gap $g_1$ having a generally constant width between the edge 23C of the ground pattern 23A and the edge 22A of the conductor pattern 22. Thereby, the insulator layer covering the substrate 100 is exposed in correspondence to the gap $g_1$. Similarly, a second ground pattern 23B having an edge 23D corresponding to the edge 22B of the conductor pattern 22 is provided on the insulator layer on the substrate 100, such that there is formed a gap $g_2$ having a generally uniform width corresponding to the width of the gap $g_1$, between the edge 22B and the edge 23D. In correspondence to the gaps $g_1$ and $g_2$, the insulator layer on the substrate 100 is exposed. It should be noted that the ground pattern 23A is connected to the substrate 100 via a contact hole 23a formed on the insulator layer, while the ground pattern 23B is connected to the substrate 100 via a contact hole 23b formed in the foregoing insulator layer.

In the substrate 100, it should be noted that there is formed an $n^+$-type region in correspondence to the ground pattern 23A, and the contact hole 23a connects the ground pattern 23A to the $n^+$-type region electrically. Similarly, an $n^+$ region is formed in the substrate 100 in correspondence to the ground pattern 23B, and the contact hole 23b connects the ground pattern 23B to the $n^+$ region thus formed. Further, there is formed another $n^+$-type region in the substrate 100 in correspondence to the conductor pattern 22, and the foregoing contact holes 22f connects the conductor pattern to the $n^+$-type region thus formed in the substrate 100.

It should be noted that the ground pattern 23A extends over the insulator layer on the substrate 100 not illustrated in FIG. 4 and is connected to a ground pad 23c formed on the substrate 100. More specifically, the ground pad 23c is formed on a protective layer such as PSG or SOG that covers the conductor pattern 22 as well as the ground patterns 23A and 23B, and is connected to the ground pattern 23A via a contact hole formed in such a protective layer. Similarly, the ground pattern 23B extends over the insulator layer on the substrate 100 and is connected to the ground pad 23d formed on the substrate 100. Similarly to the ground pad 23c, the ground pad 23d is formed on the protective layer and is connected to the ground pattern 23B via a contact hole formed in the protective layer. It should be noted that the input pad 21, too, is formed on the protective layer and is connected to the ground pattern 22 by way of the contact hole formed in the protective layer.

In the illustrated construction, it should be noted that the ground pattern 23A and the ground pattern 23B are formed at both sides of the conductor pattern 22. In correspondence to this, the ground pad 23c is formed at a side opposite to the side of the ground pattern 23d with respect to the input pad 21, although it is possible to construct the conductor patterns 23A and 23B such that the patterns 23A and 23B are electrically connected to a common ground pattern formed on the substrate 100.

Further, a first gate pattern 24A of polysilicon is provided in correspondence to the gap $g_1$ on the exposed insulator layer, with a separation from any of the conductor pattern 22 and the ground pattern 23A. Similarly, a second gate pattern 24B of polysilicon is provided in correspondence to the gap $g_2$ on the exposed insulator layer, with a separation from any of the conductor pattern 22 and the ground pattern 23B. Further, a p-channel region is formed in the substrate 100 immediately below the gate pattern 24A and the gate pattern 24B.

It should be noted that the gate pattern 24A is connected to a polysilicon pattern 25A at a contact hole 24a, while the polysilicon pattern 25A is connected to the ground pattern 23A at another contact hole 25a. Similarly, the gate pattern 24B is connected to the polysilicon pattern 25B at a contact hole 24b, while the polysilicon pattern 25B is connected to the ground pattern 23B at a contact hole 25b. It should be noted that the polysilicon patterns 25A and 25B are formed on the foregoing protective layer, while the contact holes 24a and 25a as well as the contact holes 24b and 25b are formed through the protective layer. It should be noted that the polysilicon patterns 25A and 25B respectively connect the gate patterns 24A and 24B to the corresponding ground patterns 23A and 23B such that the gate patterns 24A and 24B are held at the ground potential level.

In the layout of FIG. 4, it should be noted that there is formed an $n^+$-type diffusion region 26 in the substrate 100 such that the diffusion region 26 extends from the end 22a of the conductor pattern 22 in a direction generally perpendicular to the elongating direction of the conductor pattern 22. Further, the ground patterns 23A and 23B extend at both sides of the diffusion region 26. The diffusion region 26 includes a contact hole 27a penetrating through the insulator layer at an end opposite to the foregoing end 22a of the conductor pattern 22, wherein a separate conductor pattern 27, extending on the insulator layer toward the integrated circuit IC on the insulator layer, is connected to the diffusion region 26 at the contact hole 27a. Further, one may insert a polysilicon pattern acting as a resistance between the conductor pattern 27 and the integrated circuit 27.

Further, it should be noted that the polysilicon gate pattern 24A extends along the diffusion region 26 and is located between the ground pattern 23A and the conductor pattern 22. Similarly, the polysilicon gate pattern 24B extends along the diffusion region and is located between the ground pattern 23B and the conductor pattern 22. In correspondence to the polysilicon gate patterns 24A and 24B, there are formed p-type channel regions in the diffusion region 26 similarly to the p-type channel regions described before, such that there are formed transistors at both sides of the contact hole 27a in correspondence to the polysilicon gate patterns 24A and 24B.

Figure 5:
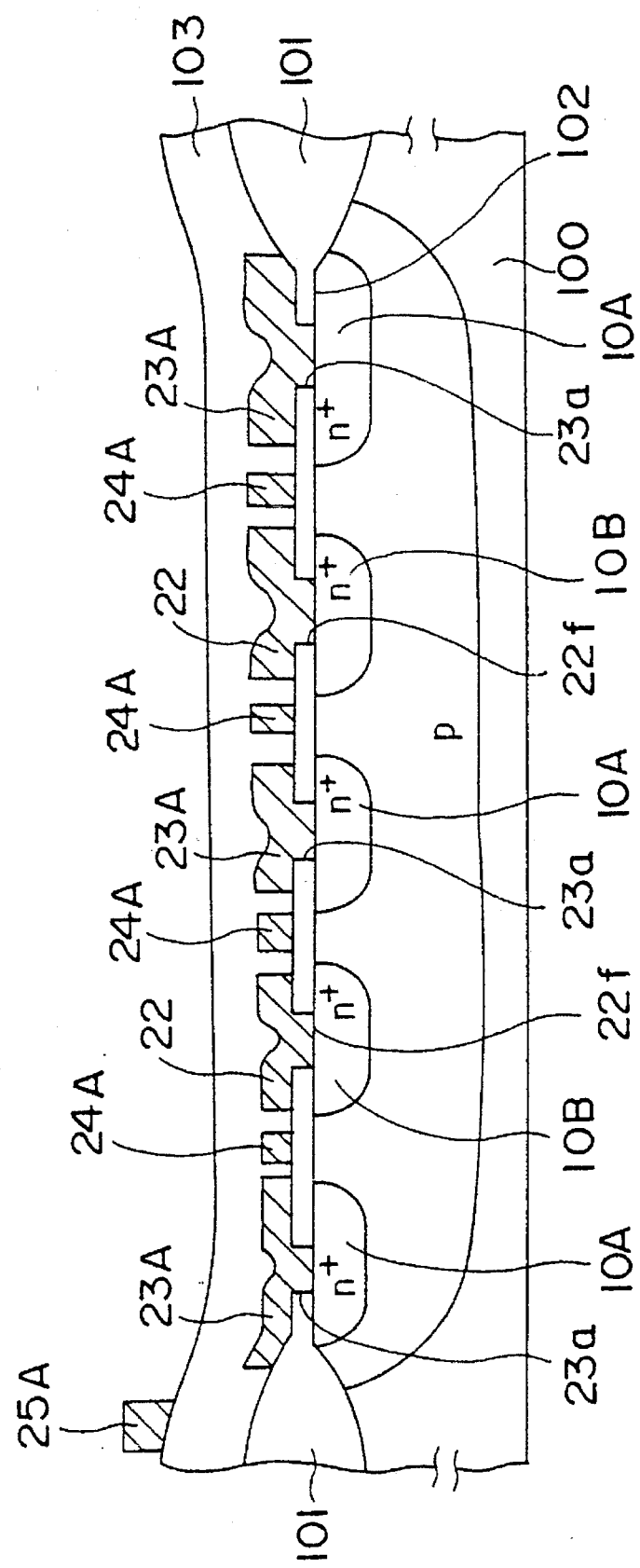
FIG. 5 is a diagram showing the input protection circuit of FIG. 4 in a cross sectional view.

FIG. 5 shows the cross sectional view of the input protection circuit of FIG. 4.

Referring to FIG. 5, the silicon substrate 100 includes a p-type well formed in correspondence to the region 10 of the silicon substrate 100, and the input protection circuit is formed on such a p-type well. It should be noted that there is formed a field oxide region 101 on the substrate 100 such that the field oxide region 101 defines the region 10, and a thin oxide film 102 is formed on the region 10 in correspondence to the insulator layer mentioned in relation to the structure of FIG. 4, such that the oxide film 102 covers the upper major surface of the substrate 100 in correspondence to the region 10.

It should be noted that there are formed a plurality of contact holes 23a in the oxide film 102, wherein it will be noted that the contact holes 23a are formed in correspondence to the ground pattern 23A. Similarly, there are formed a plurality of contact holes 22f in the oxide film 102, wherein it will be noted that the contact holes 22f are formed in correspondence to the conductor pattern 22.

The substrate 100 further includes a diffusion region 10A of $n^+$-type in correspondence to the ground pattern 23A, and the ground pattern 23A is connected to the diffusion region 10A by way of the contact holes 23a, wherein it should be noted that the diffusion region 10A forms a single continuous region in correspondence to the plan view of FIG. 4. Similarly, another $n^+$-type diffusion region 10B is formed in the substrate 100 correspondence to the conductor pattern 22, and the conductor pattern 22 is connected to the diffusion region 10B by way of the contact holes 22f, wherein it will be noted that the diffusion region 10B forms a single continuous region similarly to the diffusion region 10A. Further, the polysilicon gate pattern 24A is formed on the surface of the silicon oxide film 102 exposed in correspondence to the gap between the pattern 22 and the pattern 23A. It should be noted that there is formed a p-type region in the substrate 100 in correspondence to the polysilicon gate pattern 24A.

The entire structure described above including the patterns 22, 23A and 24A, is covered by a protective layer 103 of PSG and the like corresponding to the protective layer described with reference to FIG. 4, and the polysilicon pattern 25A is provided to extend over the protective layer 103 thus formed. As already described, the polysilicon pattern 25A is connected to the ground pattern 23A and the polysilicon pattern 24A by way of the contact holes 25a and 24a that are formed on the protective layer 103.

In the cross sectional diagram of FIG. 5, it is illustrated that the ground pattern 23A or the conductor pattern 22 is apparently formed of a plurality of separate parts, while it should be noted that this is merely an effect of illustration. As already noted with reference to the plan view of FIG. 4, the ground pattern 23A and the conductor pattern 22 are formed of a single conductive member. A similar structural relationship exists also between the conductor pattern 22 and the ground pattern 23B. As such a structure is obvious from FIG. 5, further description thereof will be omitted.

In the cross section of FIG. 5, it should be noted that there is formed of a MOS transistor in correspondence to the polysilicon pattern 24A. Thereby, the conductor pattern 22 serves for the source electrode, the conductor pattern 23A serves for the drain electrode, the $n^+$-type diffusion region 10B serves for the source region, and the $n^+$-type diffusion region 10A serves for the drain region. Further, the polysilicon pattern 24A serves for the gate electrode of the MOS transistor and the p-type region of the substrate 100 underneath the polysilicon pattern 24A serves for the p-type channel region, while it should be noted that the gate electrode 24A is connected to the drain electrode 23A via the polysilicon pattern 25A. Thus, the MOS transistor of FIG. 5 acts as a diode, and the positive or negative voltage surge applied to the conductor pattern 22 is effectively clamped.

As the MOS transistor extends zigzag along the polysilicon pattern 24A or 24B continuously, it is possible to dissipate the electric charges from the conductor pattern 22 to the ground pattern 23A or 23B efficiently for the entire length of the transistor.

Figure 2:
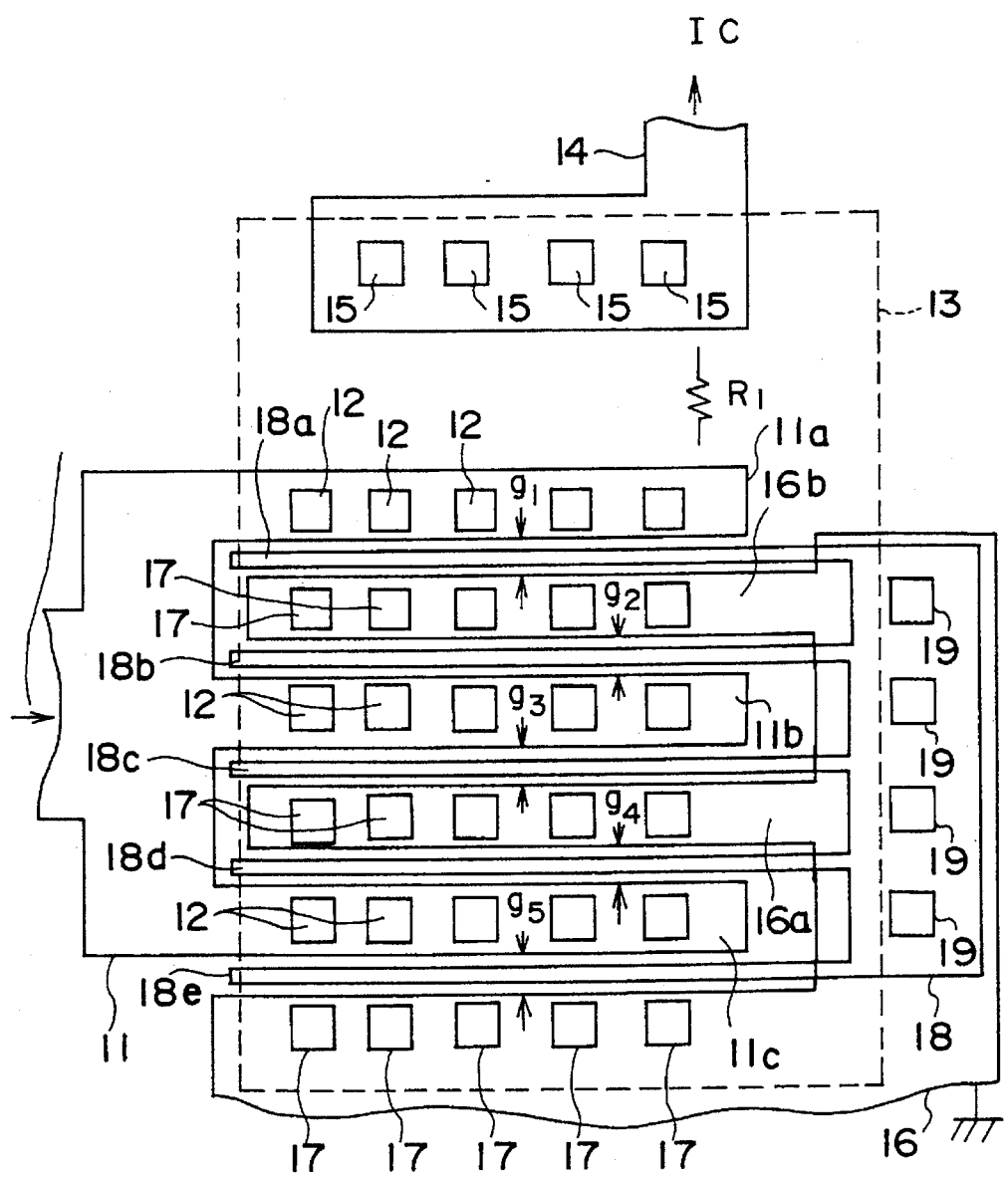
FIG. 2 is a diagram showing the layout of a conventional input protection circuit.
Figure 3:
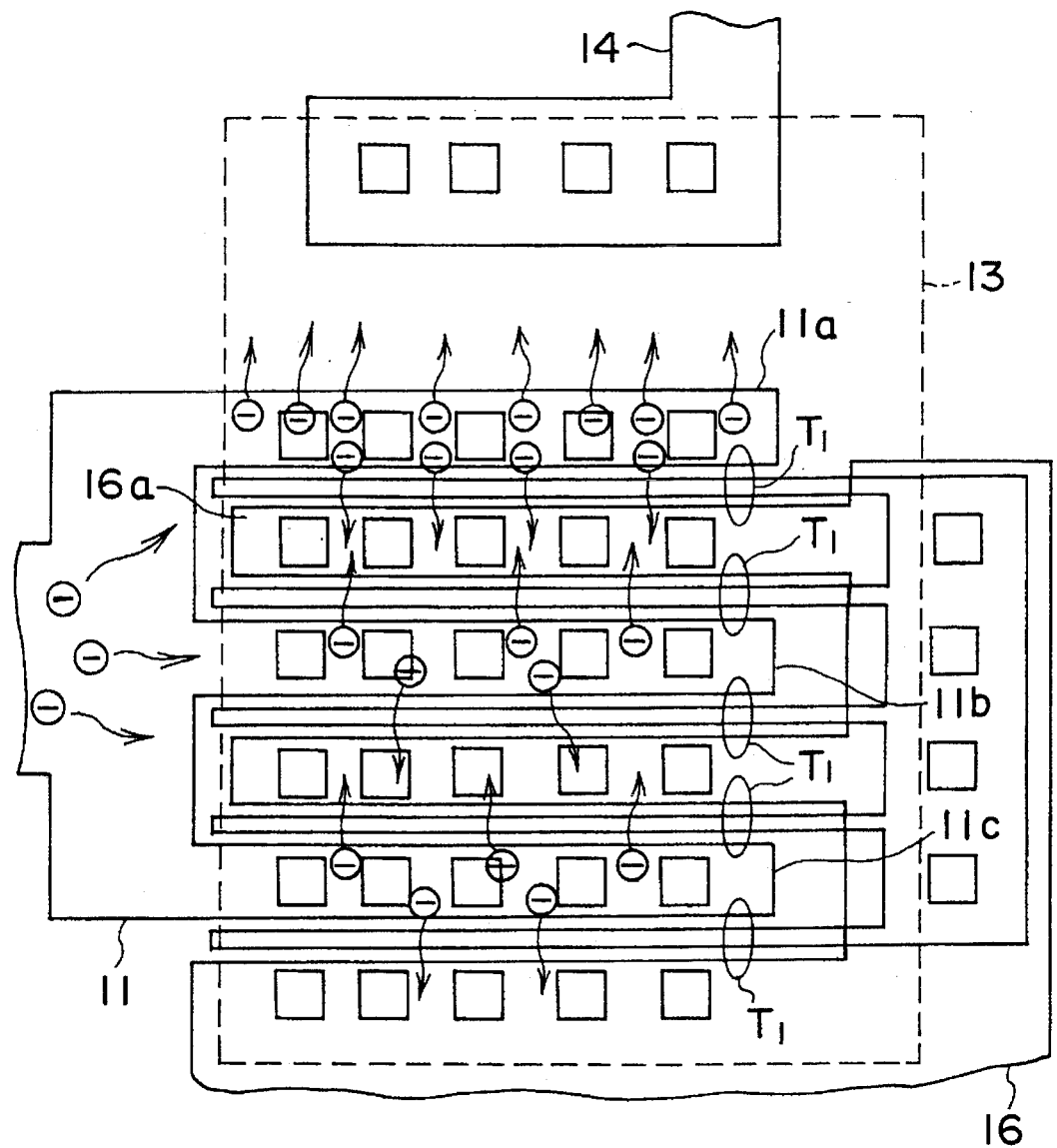
FIG. 3 is a diagram showing the problem associated with the layout of FIG. 2.

It should be noted that the conductor pattern 22 of the input protection circuit 1 of FIG. 4 does not include branches that causes a dead end of the electric current as compared with the case of the circuit of FIG. 2. Thus, the entire length of the MOS transistor along the conductor pattern 22 contributes to the dissipation of the voltage surge, and the protection circuit 1 can successfully handle a very large voltage surge. Further, by extending the polysilicon patterns 24A and 24B to the part where the contact hole 27a is formed as indicated in FIG. 4, it is possible to form additional MOS transistors at both sides of the contact hole 27a for further dissipation of the voltage surge.

Figure 6:
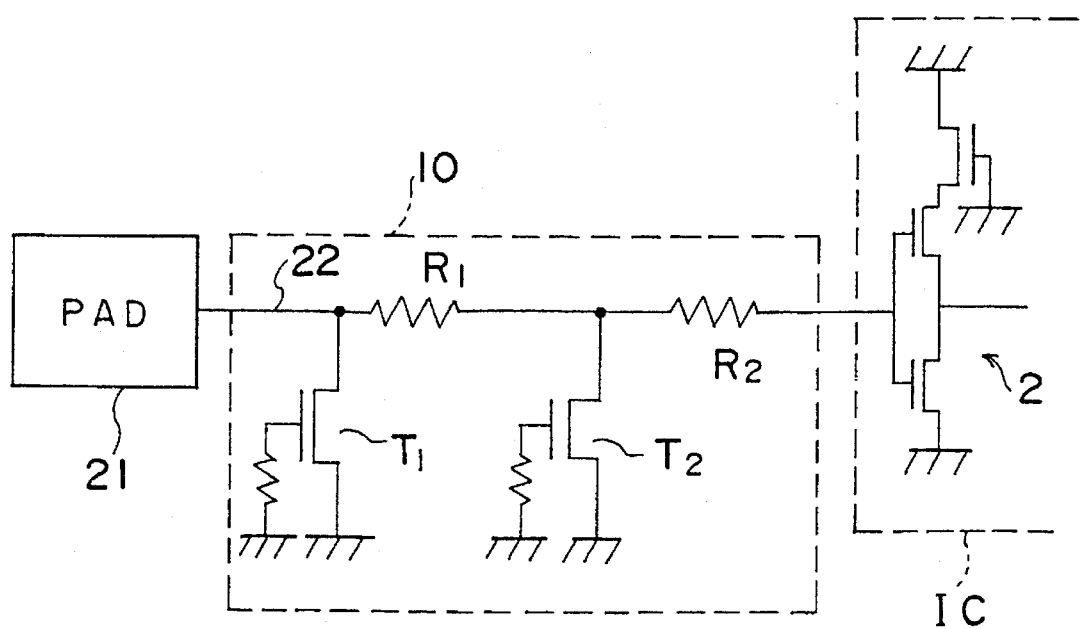
FIG. 6 is a circuit diagram showing the equivalent circuit diagram of the input protection circuit of FIG. 4.

FIG. 6 shows an equivalent circuit diagram of the input protection circuit of FIG. 4.

Figure 1:
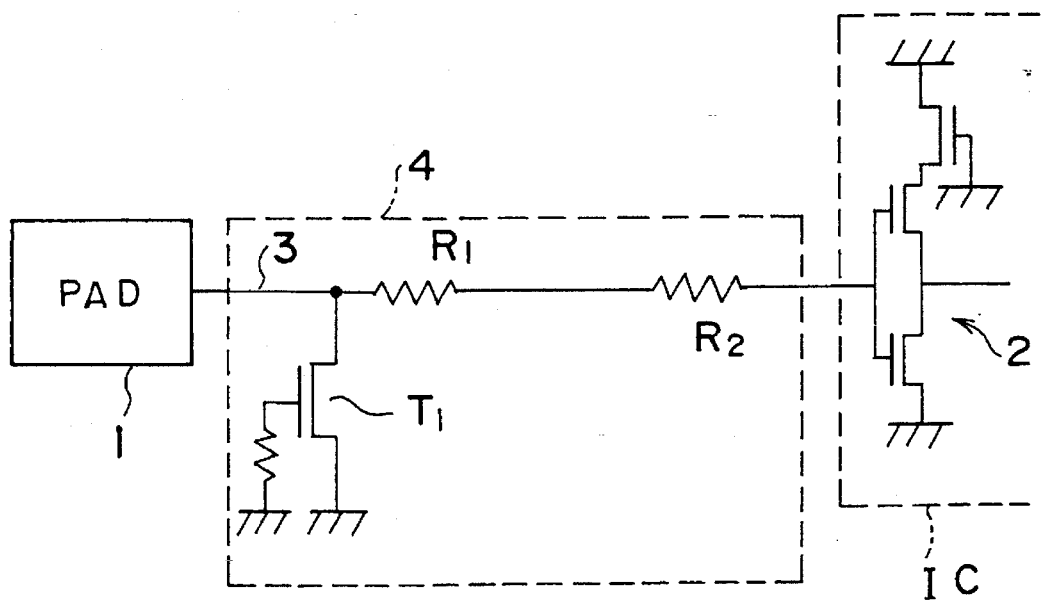
FIG. 1 is a circuit diagram showing the general construction of a conventional input protection circuit.

Referring to FIG. 6, the illustrated circuit has a layout similar to the circuit of FIG. 1 and includes MOS transistors designated as $T_1$, wherein the MOS transistors are formed along the polysilicon patterns 24A and 24B in correspondence to the gaps $g_1$ and $g_2$. Further, the diffusion region 26 extending beyond the end 22a of the conductor pattern 22 acts as a resistance $R_1$. Further, it will be noted that there is formed another transistor $T_2$ in correspondence to the part of the polysilicon patterns 24A and 24B extending at both sides of the contact hole 27a. In addition, there is formed another resistance $R_2$ in correspondence to a polysilicon pattern (not shown in FIG. 4) which may be inserted between the aluminum pattern 27 and the first stage circuit 2 of the integrated circuit IC. As the cross sectional view of the transistor $T_2$ is obvious in view of the cross sectional view of FIG. 5, further description will be omitted.

It should be noted that the layout of the protection circuit of FIG. 4 can be modified variously. For example, it is possible to provide the projections 22b–22e only one side of the conductor pattern 22. Further, one may change the widths $W_1$, $W_2$ and $W_3$ of the conductor pattern 22 stepwise along the elongating direction of the conductor pattern 22.

Figure 7:
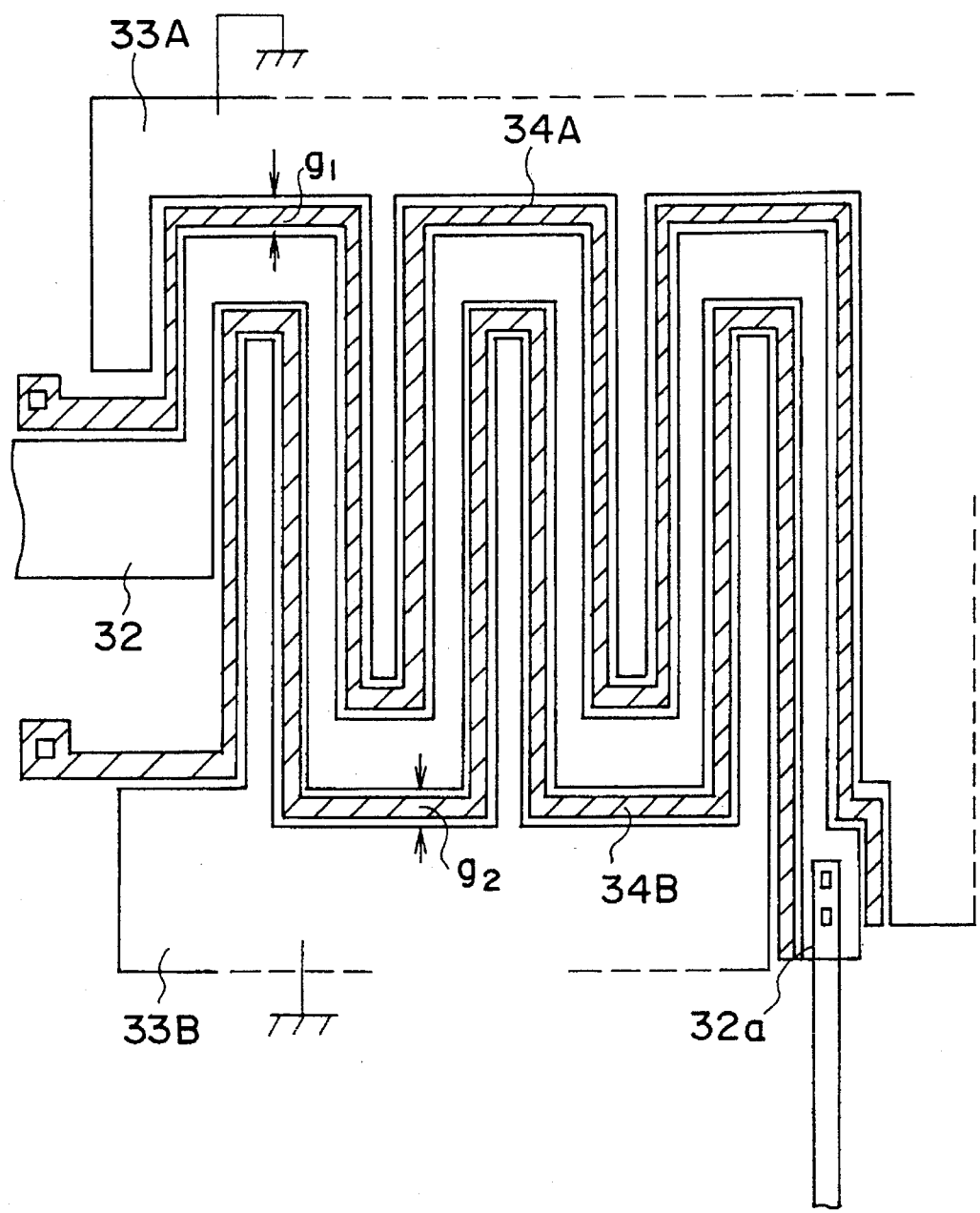
FIG. 7 is a diagram showing the layout of an input protection circuit according to a second embodiment of the present invention.

FIG. 7 shows the layout of an input protection circuit according to a second embodiment of the present invention, wherein the input protection circuit of FIG. 7 is formed on a substantially same layered structure constructed on the substrate 100 as in the case of FIG. 5.

Referring to FIG. 7, the input protection circuit includes a zigzag conductor pattern 32 in place of the conductor pattern 22 and corresponding ground patterns 33A and 33B, wherein the ground pattern 33A corresponds to the ground pattern 23A of FIG. 4 and the ground pattern 33B corresponds to the ground pattern 23B of FIG. 4. In correspondence to the zigzag shape of the conductor pattern 32, it should be noted that the ground patterns 33A and 33B have a comb shape including fingers such that there is formed a zigzag gap $g_1$ between the conductor pattern 32 and the ground pattern 33A. Similarly, there is formed a zigzag gap $g_2$ between the conductor pattern 32 and the ground pattern 33B. In correspondence to the gap $g_1$, a polysilicon pattern extends zigzag over the insulator layer covering the substrate 100 as a gate electrode. Similarly, a polysilicon pattern extends zigzag over the insulator layer on the substrate in correspondence to the gap $g_2$ as another gate electrode. Thereby, a pair of MOS transistors are formed at both sides of the conductor pattern 32 in correspondence to the polysilicon patterns 34A and 34B. In such a structure, too, the electric signal supplied to the input pad flows through the conductor pattern 32 from a first end corresponding to the input pad to a second opposite end 32a, without branching. Thus, the voltage surge applied to such an electric signal is successfully dissipated to the ground via the transistors formed continuously along both sides of the conductor pattern 32. In the protection circuit of FIG. 7, too, it is possible to eliminate the problem of the circuit of FIG. 2 that only a part of the MOS transistors contributes to the clamping of the surge.

Further, the present invention is not limited to the embodiments described heretofore, but various variations and modifications may be made without departing from the scope of the invention.

What is claimed is:

1. An input protection circuit, comprising:

a conductor pattern provided on a semiconductor substrate formed with an integrated circuit, said conductor pattern having a first end connected to an input pad provided on said semiconductor substrate and a second, opposite end and defined by first and second edges both extending between said first and second ends;

a first ground pattern on said semiconductor substrate, said first ground pattern being defined by a third edge having a shape corresponding to said first edge, said first ground pattern being provided on said semiconductor substrate so as to form a first gap having generally a uniform width between said first and third edges;

a second ground pattern on said semiconductor substrate, said second ground pattern being defined by a fourth edge having a shape corresponding to said second edge, said second ground pattern being provided on said semiconductor substrate so as to form a second gap having generally a uniform width between said second and fourth edges;

a first gate pattern provided on said semiconductor substrate in correspondence to said first gap such that said first gate pattern extends with a separation from any of said first and third edges;

a second gate pattern provided on said semiconductor substrate in correspondence to said second gap such that said second gate pattern extends with a separation from any of said second and fourth edges;

a first channel region formed on said semiconductor substrate in correspondence to said first gate pattern;

a second channel region formed on said semiconductor substrate in correspondence to said second gate pattern;

a source region formed on said semiconductor substrate in correspondence to said conductor pattern;

a first drain region formed on said semiconductor substrate in correspondence to said first ground pattern;

a second drain region formed on said semiconductor substrate in correspondence to said second ground pattern;

a first contact structure provided on said conductor pattern for connecting said conductor pattern to said source region electrically;

a second contact structure provided on said first ground pattern for connecting said first ground pattern to said first drain region;

a third contact structure provided on said second ground pattern for connecting said second ground pattern to said second drain region;

a first ground structure for grounding said first gate pattern;

a second ground structure for grounding said second gate pattern;

a diffusion region formed on said semiconductor substrate so as to extend from said second end of said conductor pattern toward said integrated circuit, said diffusion region having a resistance; and a lead pattern extending from said diffusion region toward said integrated circuit for carrying electric signals supplied to said input pad to said integrated circuit;

said conductor pattern, said first ground pattern, said first gate pattern, said first channel region, said source region and said first drain region forming a first transistor;

said conductor pattern, said second ground pattern, said second gate pattern, said second channel region, said source region and said second drain region forming a second transistor;

said first and second ground patterns forming two, mutually separated conducting members on said semiconductor substrate;

said first and second gate patterns forming two, mutually separated conducting members on said semiconductor substrate;

said first and second drain regions being formed on said substrate with a mutual separation from each other.

2. An input protection circuit as claimed in claim 1, wherein said conductor pattern includes a projection on at least one of said first and second edges such that said projection protrudes in a direction generally perpendicular to an elongating direction of said conductor pattern.

3. An input protection circuit as claimed in claim 1, wherein said conductor pattern extends zigzag from said first end to said second end.

4. An input protection circuit as claimed in claim 1, wherein said input protection circuit further includes another conductor pattern connected to said integrated circuit, such that said another conductor pattern is contacted to said diffusion region by a contact hole at a location offset from said second end of said conductor pattern toward said integrated circuit.

5. An input protection circuit as claimed in claim 4, wherein said first and second gate patterns extend generally parallel with each other along said diffusion region from said second end of said conductor pattern to said contact hole, with a mutual separation from each other, and wherein said input protection circuit further includes a pair of transistors different from any of said first and second transistors at both sides of said contact hole, such that said pair of transistors have said first and second gate patterns as respective gate electrodes.

6. An input circuit as claimed in claim 1, wherein each of said first, second and third contact structures includes a plurality of contact holes formed in an insulation layer covering an upper major surface of said substrate.

7. An input circuit as claimed in claim 1, wherein said first ground structure comprises a first polysilicon pattern having a first end connected to said first gate pattern by way of a contact hole and a second, opposite end connected to said first ground pattern by way of a different contact hole, and wherein said second ground structure comprises a second polysilicon pattern having a first end connected to said second gate pattern by way of a contact hole and a second, opposite end connected to said second ground pattern by way of a different contact hole.

8. An integrated circuit, comprising:

a semiconductor substrate;

an input pad provided on said substrate;

a circuit provided on said semiconductor substrate for receiving an input signal from said input pad; and an input protection circuit provided on said semiconductor substrate between said input pad and said circuit for dissipating a voltage surge on said input signal, said input protection circuit comprising:

a conductor pattern provided on said semiconductor substrate, said conductor pattern having a first end connected to said input pad and a second, opposite end and defined by first and second edges both extending between said first and second ends;

a first ground pattern on said semiconductor substrate, said first ground pattern being defined by a third edge having a shape corresponding to said first edge, said first ground pattern being provided on said semiconductor substrate so as to form a first gap having generally a uniform width between said first and third edges;

a second ground pattern on said semiconductor substrate, said second ground pattern being defined by a fourth edge having a shape corresponding to said second edge, said second ground pattern being provided on said semiconductor substrate so as to form a second gap having generally a uniform width between said second and fourth edges;

a first gate pattern provided on said semiconductor substrate in correspondence to said first gap such that said first gate pattern extends with a separation from any of said first and third edges;

a second gate pattern provided on said semiconductor substrate in correspondence to said second gap such that said second gate pattern extends with a separation from any of said second and fourth edges;

a first channel region formed on said semiconductor substrate in correspondence to said first gate pattern;

a second channel region formed on said semiconductor substrate in correspondence to said second gate pattern;

a source region formed on said semiconductor substrate in correspondence to said conductor pattern;

a first drain region formed on said semiconductor substrate in correspondence to said first ground pattern;

a second drain region formed on said semiconductor substrate in correspondence to said second ground pattern;

a first contact structure provided on said conductor pattern for connecting said conductor pattern to said source region electrically;

a second contact structure provided on said first ground pattern for connecting said first ground pattern to said first drain region;

a third contact structure provided on said second ground pattern for connecting said second ground pattern to said second drain region;

a first ground structure for grounding said first gate pattern;

a second ground structure for grounding said second gate pattern;

a diffusion region formed on said semiconductor substrate so as to extend from said second end of said conductor pattern toward said circuit, said diffusion region having a resistance; and a lead pattern extending from said diffusion region toward said circuit for carrying electric signals supplied to said input pad to said circuit;

said conductor pattern, said first ground pattern, said first gate pattern, said first channel region, said source region and said first drain region forming a first transistor;

said conductor pattern, said second ground pattern, said second gate pattern, said second channel region, said source region and said second drain region forming a second transistor;

said first and second ground patterns forming two, mutually separated conducting members on said semiconductor substrate;

said first and second gate patterns forming two, mutually separated conducting members on said semiconductor substrate.

* * * * *